United States Patent
Kim

(10) Patent No.: US 7,999,313 B2
(45) Date of Patent: Aug. 16, 2011

(54) SEMICONDUCTOR DEVICE HAVING VERTICAL PILLAR TRANSISTORS AND METHOD FOR MANUFACTURING THE SAME

(75) Inventor: Kyung Do Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 100 days.

(21) Appl. No.: 12/173,949

(22) Filed: Jul. 16, 2008

(65) Prior Publication Data

US 2009/0256187 A1 Oct. 15, 2009

(30) Foreign Application Priority Data

Apr. 10, 2008 (KR) .................... 10-2008-0033301

(51) Int. Cl.
*H01L 29/66* (2006.01)
(52) U.S. Cl. . 257/332; 257/331; 257/333; 257/E21.336; 257/E21.345; 438/294; 438/587
(58) Field of Classification Search .......... 257/331–333, 257/E21.336, E21.345; 438/294, 587
See application file for complete search history.

(56) References Cited

U.S. PATENT DOCUMENTS

| 5,451,800 | A | * | 9/1995 | Mohammad | 257/191 |
|---|---|---|---|---|---|
| 6,477,080 | B2 | * | 11/2002 | Noble | 365/154 |
| 7,348,628 | B2 | | 3/2008 | Yoon et al. | |
| 7,719,869 | B2 | * | 5/2010 | Slesazeck | 365/63 |
| 2003/0008461 | A1 | * | 1/2003 | Forbes et al. | 438/268 |
| 2007/0158722 | A1 | * | 7/2007 | Forbes | 257/296 |
| 2007/0246783 | A1 | * | 10/2007 | Moon et al. | 257/384 |
| 2007/0290258 | A1 | * | 12/2007 | Son et al. | 257/330 |

FOREIGN PATENT DOCUMENTS

| CN | 101093855 A | 12/2007 |
|---|---|---|
| DE | 10219329 A1 | 11/2003 |
| KR | 10-0618875 A | 5/2006 |
| KR | 10-0660881 B1 | 12/2006 |
| KR | 10-0712552 B1 | 4/2007 |

* cited by examiner

*Primary Examiner* — Wael M Fahmy
*Assistant Examiner* — John C Ingham
(74) *Attorney, Agent, or Firm* — Ladas & Parry LLP

(57) ABSTRACT

A semiconductor device includes vertical pillar transistors formed in respective silicon pillars of a silicon substrate. The gates of the vertical pillar transistor are selectively formed on a single surface of lower portions of the silicon pillars, and drain areas of the vertical pillar transistors are connected with one another.

7 Claims, 7 Drawing Sheets

SEMICONDUCTOR DEVICE HAVING VERTICAL PILLAR TRANSISTORS AND METHOD FOR MANUFACTURING THE SAME

CROSS-REFERENCE TO RELATED APPLICATIONS

The present application claims priority to Korean patent application number 10-2008-0033301 filed on Apr. 10, 2008, which is incorporated herein by reference in its entirety.

BACKGROUND OF THE INVENTION

The present invention relates to a semiconductor device and more particularly to a semiconductor device and a method of manufacturing the same, in which floating body memories are formed in vertical pillars.

Research has been conducted for a semiconductor device that can perform desired operations stably as future developments lead to higher integration, greater operation speeds, and reduced power consumption of the semiconductor device. As a result of the research, a floating body memory, in which a plurality of carriers are charged up in a floating body without using a capacitor to change the threshold voltage (Vt) of a transistor, making it possible to write and read data has been disclosed.

In the floating body memory described above, if hot carriers are generated when a high positive voltage potential is applied to a drain, electron-hole pairs are produced as a result of impact ionization by the hot carriers. When the electron-hole pairs are produced due to impact ionization, holes accumulate in a silicon layer being a floating body and electrons are discharged to the drain by the high voltage applied to the drain. Accordingly, the threshold voltage (Vt) of a transistor is reduced as the holes accumulate in the silicon substrate, and when applying a voltage to the drain, a large amount of current can flow, by which the transistor serves as a memory. For example, in the floating body memory, "0" indicates a state in which holes are not accumulated and the threshold voltage is high, and similarly "1" indicates the state in which holes are accumulated and the threshold voltage is low. In the floating body memory, an erasing operation executed by applying a forward bias to the PN junction between a source and the silicon substrate and thereby discharging the accumulated holes to the outside.

In the floating body memory discussed above no capacitor is formed, and therefore a capacitor forming process and a capacitor forming area are not required. Accordingly, when compared to a typical dynamic random access memory (DRAM), the floating body memory is advantageous in that the number of processes required to realize the floating body memory is decreased and density is increased.

The floating body memory is realized on a silicon on insulator (SOI) wafer having a stacked structure that includes a silicon substrate, a buried oxide layer, and a silicon layer. The floating body memory is not realized on a single crystal silicon wafer made of bulk silicon.

However, the SOI wafer is highly expensive and using the SOI wafer is difficult, and as such the manufacturing costs are great when realizing the floating body memory with the SOI wafer as discussed above. Further, the buried oxide layer is formed through an oxygen ion implantation process and an annealing process in the SOI wafer, which can result in defects in silicon due to the oxygen ion implantation process. Therefore, the use of the SOI wafer is likely to deteriorate the characteristics of a semiconductor device.

SUMMARY OF THE INVENTION

Embodiments of the present invention are directed to a semiconductor device which is realized by forming floating body memories in vertical pillars that reduces the manufacturing cost can by not using an SOI wafer, and a method for manufacturing the same.

Also, embodiments of the present invention are directed to a semiconductor device which is realized without using an SOI wafer and can thereby prevent defects from being caused in silicon due to the formation of a buried oxide layer in the SOI wafer, and a method for manufacturing the same.

Further, embodiments of the present invention are directed to a semiconductor device in which floating body memories having a vertical pillar structure and can be formed using an ordinary single crystal silicon wafer so that the occurrence of defects in silicon can be avoided, thereby improving the operation characteristics and reliability of the semiconductor device, and a method for manufacturing the same.

A semiconductor device according to an embodiment of the present invention includes vertical pillar transistors formed in respective silicon pillars of a silicon substrate. Gates of the vertical pillar transistor are selectively formed on one surface of lower portions of the silicon pillars, and drain areas of the vertical pillar transistors are formed to be connected with one another.

The gates are selectively formed only on opposite surfaces of two adjacent vertical pillar transistors.

The gates are formed to be buried in one surface of the lower portions of the silicon pillars.

According to an embodiment of the present invention, a semiconductor device comprises a silicon substrate having a plurality of silicon pillars; gates formed on one surfaces of lower portions of the respective silicon pillars; source areas formed in portions of the silicon pillars over the gates; drain areas formed in portions of the silicon substrate under the gates, so that the drain areas, the gates and the source areas constitute vertical pillar transistors; and word lines formed to connect gates of vertical pillar transistors arranged in one direction, wherein the drain areas are formed such that drain areas arranged in another direction perpendicular to one direction are connected with one another.

The gates are selectively formed only on opposite surfaces of two adjacent vertical pillar transistors.

The gates are formed to be buried in one surface of the lower portions of the silicon pillars.

The semiconductor device further comprises an insulation layer filled between the vertical pillar transistors including the word lines.

In a method for manufacturing a semiconductor device according to an embodiment of the present invention gates of vertical pillar transistors are respectively formed on one surface of lower portions of a plurality of silicon pillars of a silicon substrate, and drain areas of the vertical pillar transistors are formed to be connected with one another.

The gates are selectively formed only on opposite surfaces of two adjacent vertical pillar transistors.

The gates are formed to be buried in one surface of the lower portions of the silicon pillars.

According to another embodiment of the present invention a method for manufacturing a semiconductor device comprises the steps of etching a silicon substrate and thereby forming a plurality of silicon pillars; filling a first insulation layer into gaps between the silicon pillars, excluding gate forming gaps; etching isotropically surfaces of lower portions of the silicon pillars in the gate forming gaps which are not filled with the first insulation layer; forming gates in the lower portions of the silicon pillars which are isotropically etched; removing the first insulation layer; forming drain areas in portions of the silicon substrate under the gates; forming a second insulation layer to fill the gaps between the silicon pillars which have the gates selectively formed on one surfaces of the lower portions thereof; forming word lines in the second insulation layer to connect gates arranged in one direction; forming a third insulation layer to fill the gaps between the silicon pillars including the word lines; forming source areas in portions of the silicon pillars over the gates so as to constitute vertical pillar transistors in cooperation with the gates and the drain areas; and annealing the resultant silicon substrate formed with the source areas, such that drain areas of vertical pillar transistors arranged in another direction perpendicular to one direction are connected with one another.

The step of forming the silicon pillars comprises the steps of forming a hard mask on the silicon substrate to cover silicon pillar forming areas; etching the silicon substrate and thereby defining first grooves; forming first spacers on sidewalls of the first grooves and the hard mask; and etching portions of the silicon substrate on bottoms of the first grooves using the hard mask and the first spacers as an etch mask and thereby defining second grooves.

After the step of defining the second grooves, the method further comprises the step of forming second spacers on surfaces of the first spacers and the second grooves.

The first insulation layer comprises an oxide layer.

Each of the second and third insulation layers comprises an oxide layer.

The gates are respectively formed only on opposite surfaces of adjoining two vertical pillar transistors.

The gates are formed to be buried in one surfaces of the lower portions of the silicon pillars.

After the step of forming the drain areas and before the step of forming the second insulation layer, the method further comprises the step of etching the drain areas formed in one direction and thereby separating the drain areas from one another.

DESCRIPTION OF SPECIFIC EMBODIMENTS

Hereafter, specific embodiments of the present invention will be described in detail with reference to the attached drawings.

Figure 1:
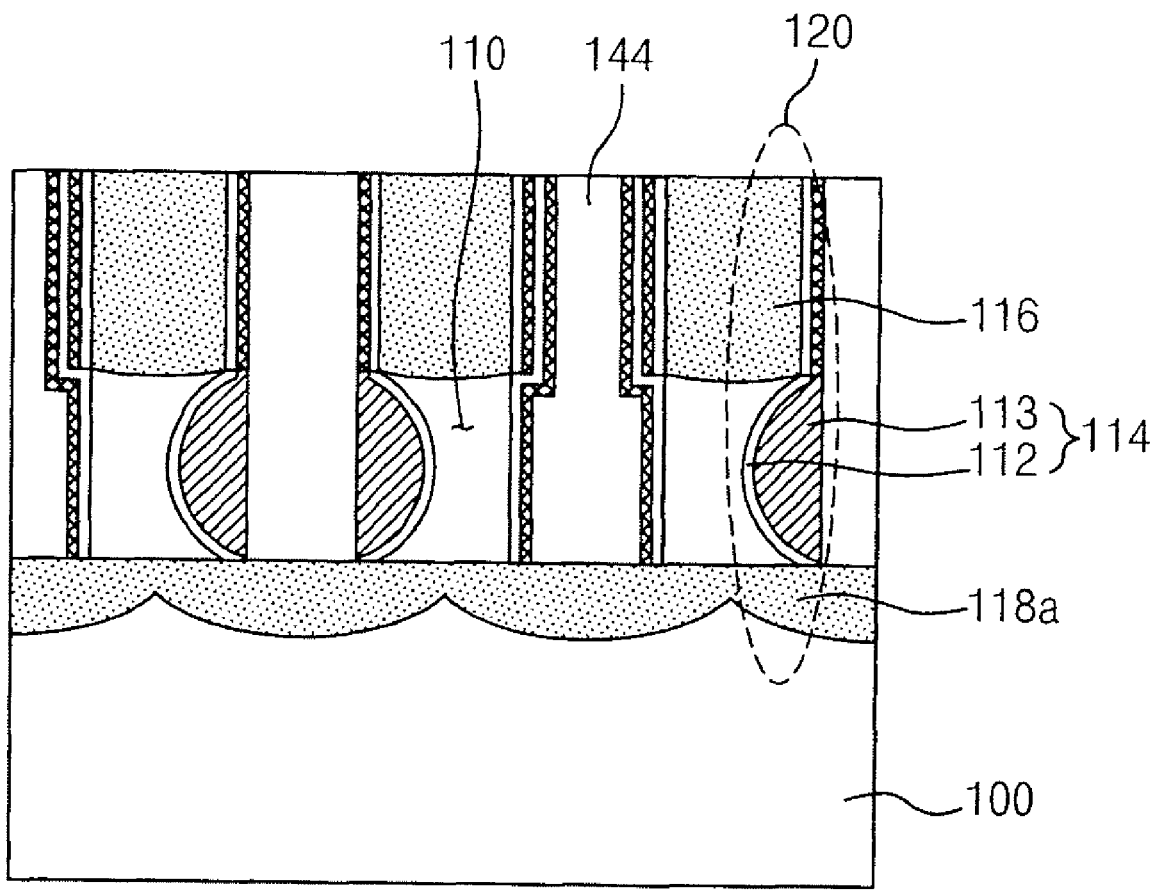
FIG. 1 is a sectional view showing a semiconductor device in accordance with an embodiment of the present invention.

FIG. 1 is a cross-sectional view showing a semiconductor device in accordance with an embodiment of the present invention.

Referring to FIG. 1, silicon pillars 110 are formed on the surface of a silicon substrate 100, and vertical pillar transistors 120, capable of operating as floating body memories, are formed within the silicon pillars 110. A first insulation layer (not shown), a second insulation layer 144 and, a third insulation layer (not shown) are formed between the vertical pillar transistors 120.

Each vertical pillar transistor 120 includes a gate 114, which buried in a single surface of the lower portion of each silicon pillar 110, a source area 116, which is formed within the silicon pillar 110 over the gate 114, and a drain area 118a, which is formed in the silicon substrate 100 under the gate 114.

The drain areas 118a formed in the silicon substrate 100 are connected with one another such that the bodies of the vertical pillar transistors 120 are floated. That is, the bodies of the vertical pillar transistors 120 serve as floating bodies.

The gate 114 of each vertical pillar transistor 120 is formed only on one surface of a lower portion of the silicon pillar 110 for reasons that will be described below. When the gate 114 is formed to surround the lower portion of the silicon pillar 110, the vertical pillar transistor 120 realized in the silicon pillar 110 can operate as a floating body memory if the width of the silicon pillar 110 is substantial to some extent, since the depletion areas defined on both sides cannot meet with each other when viewed on a cross-section. However, when the gate is formed to surround the lower portion of the silicon pillar 110, the vertical pillar transistor 120 cannot operate as a floating body memory when the width of the silicon pillar 110 decreases causing the depletion areas defined on both sides of the silicon pillar 110 to overlap with each other such that the channel of the vertical pillar transistor 120 is fully depleted. Therefore, according to an embodiment of the present invention the gate 114 is formed only on one surface of the lower portion of the silicon pillar 110 to prevent the full depletion of the channel of the vertical pillar transistor 120.

Although not shown in the FIG. 1, word lines to connect the gates 114 are formed between the vertical pillar transistors 120 through a damascene process, and are arranged perpendicular to the direction in which the drain areas 118a are connected with one another.

As described above, in the semiconductor device according to an embodiment of the present invention, the floating body memory can be realized using an ordinary single crystal silicon wafer because the floating body memory is formed using the vertical pillar transistors. Accordingly, in the semiconductor device according to an embodiment of the present invention, manufacturing costs can be reduced because it is not necessary to use the costly SOI wafer.

Further, because the semiconductor device according to an embodiment of the present invention is realized using an ordinary single crystal silicon wafer instead of the SOI wafer having the stacked structure, it is possible to prevent defects from being caused in silicon due to the formation of a buried oxide layer in the SOI wafer, and accordingly, the characteristics and the reliability of the semiconductor device can be improved.

In addition, since the semiconductor device according to the present invention employs the vertical pillar transistor structure, the floating body memories can properly operate even as the width of the silicon pillar is reduced due to higher integration, and therefore the present invention can be advantageously applied to the manufacture of a highly integrated semiconductor device.

Figure 2A:
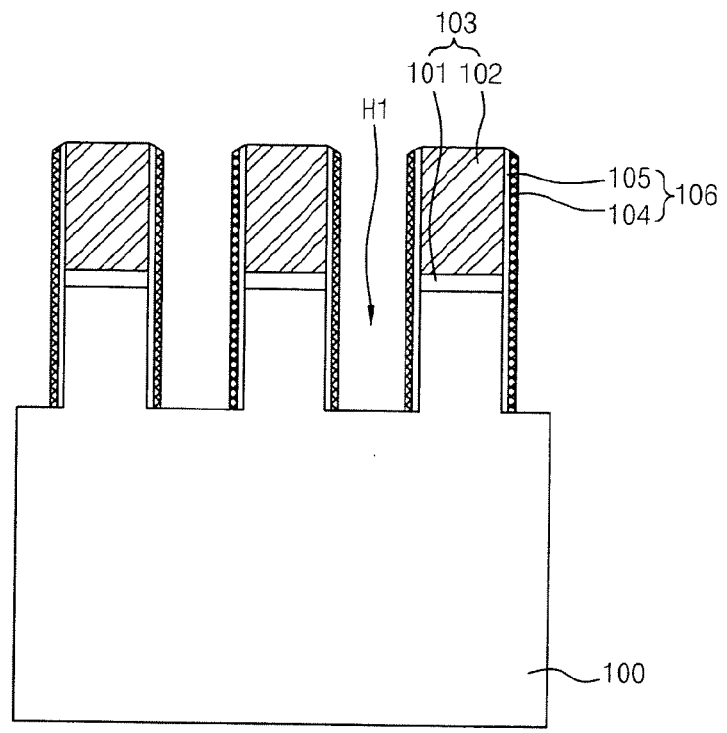
FIGS. 2A through 2H are cross-sectional views showing the processes of a method for manufacturing a semiconductor device in accordance with another embodiment of the present invention.
Figure 2B:
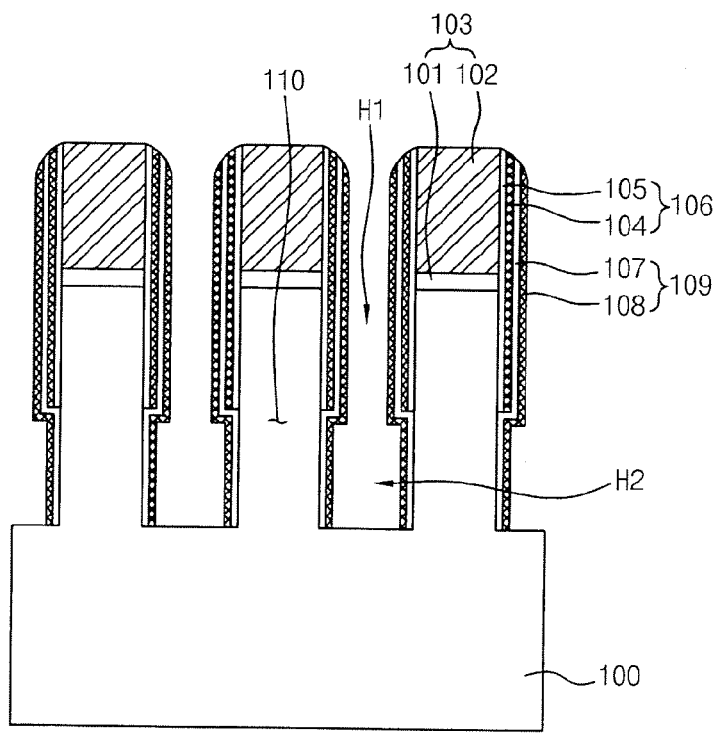
Figure 2C:
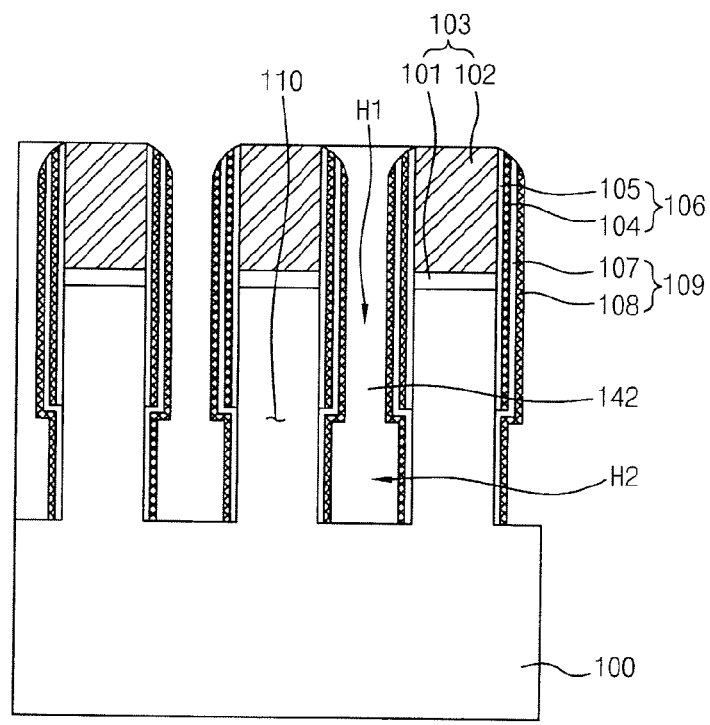
Figure 2D:
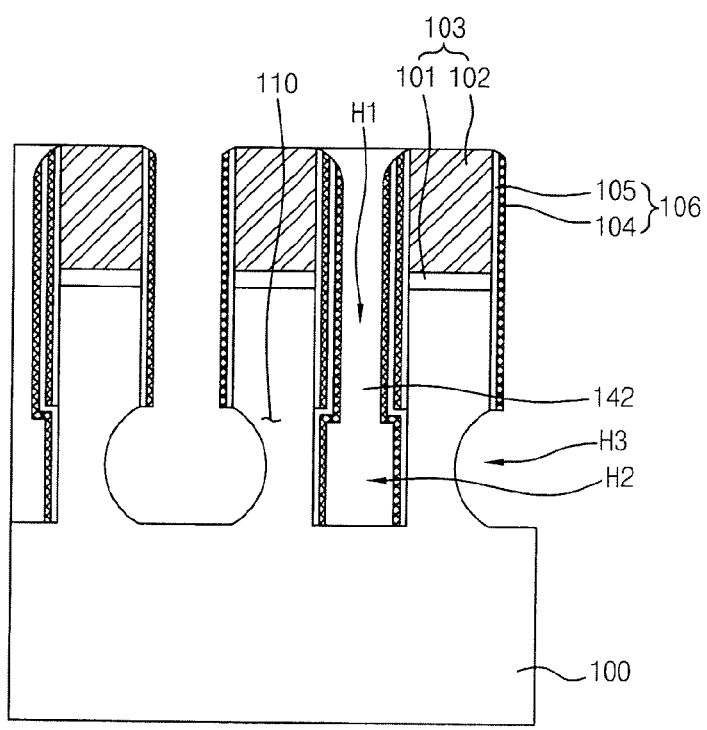
Figure 2E:
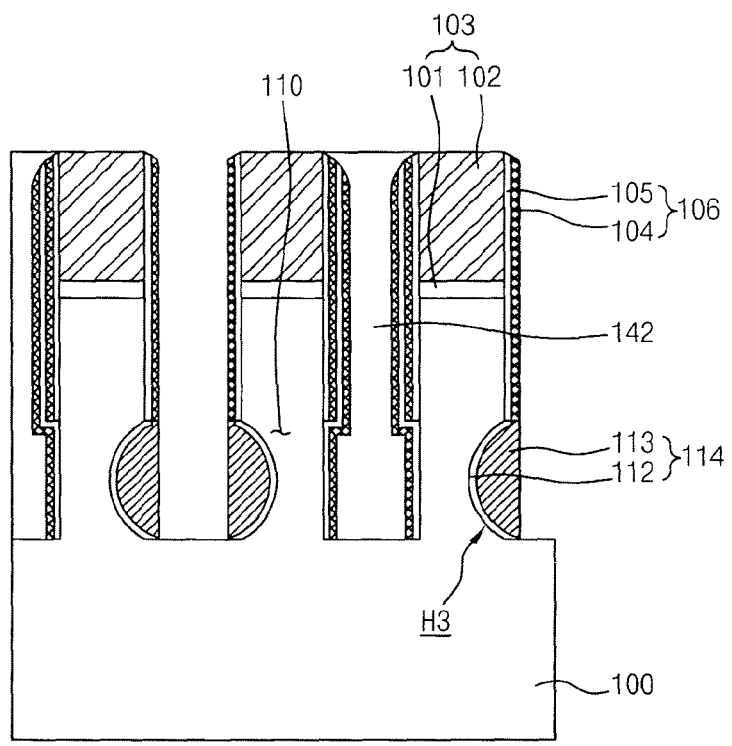
Figure 2F:
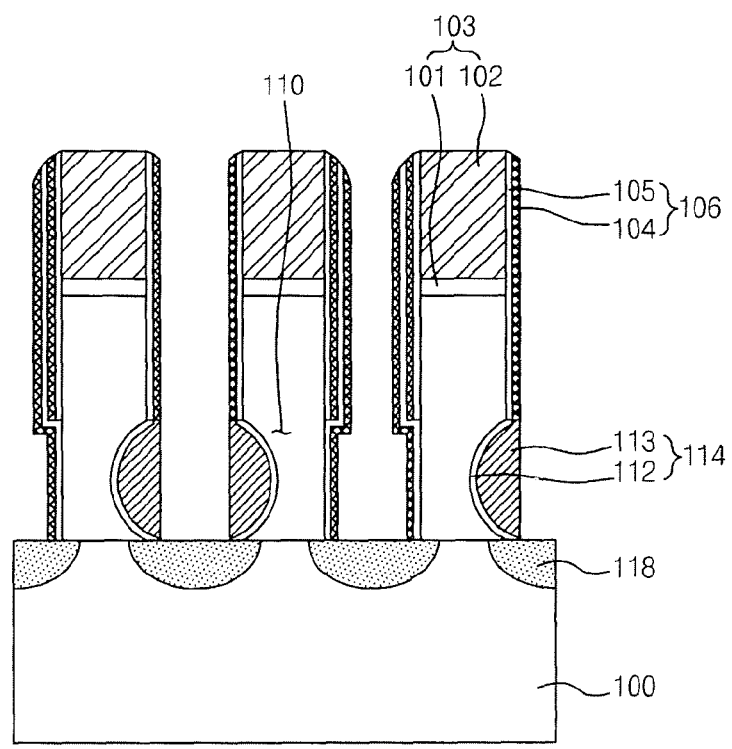
Figure 2G:
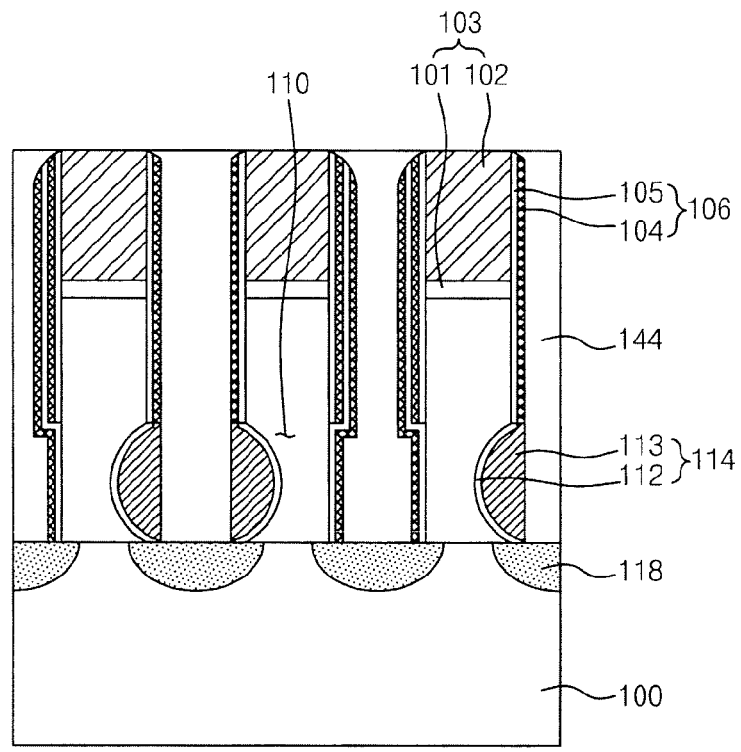
Figure 2H:
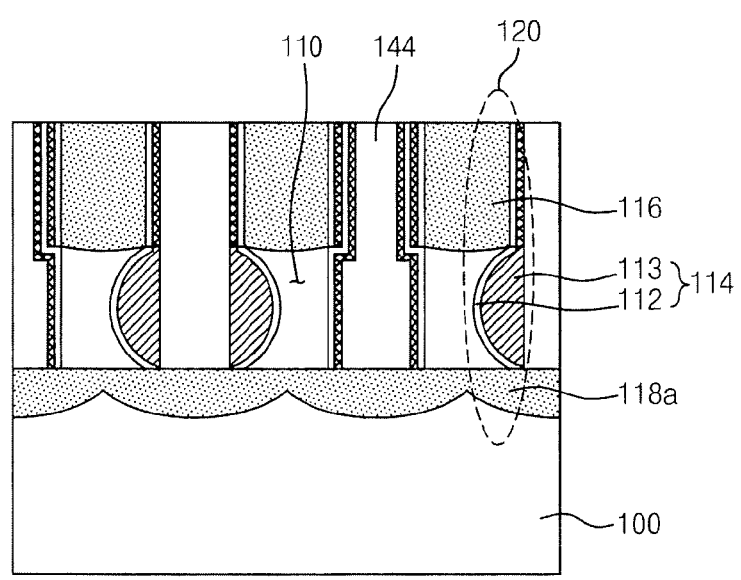
Figure 3:
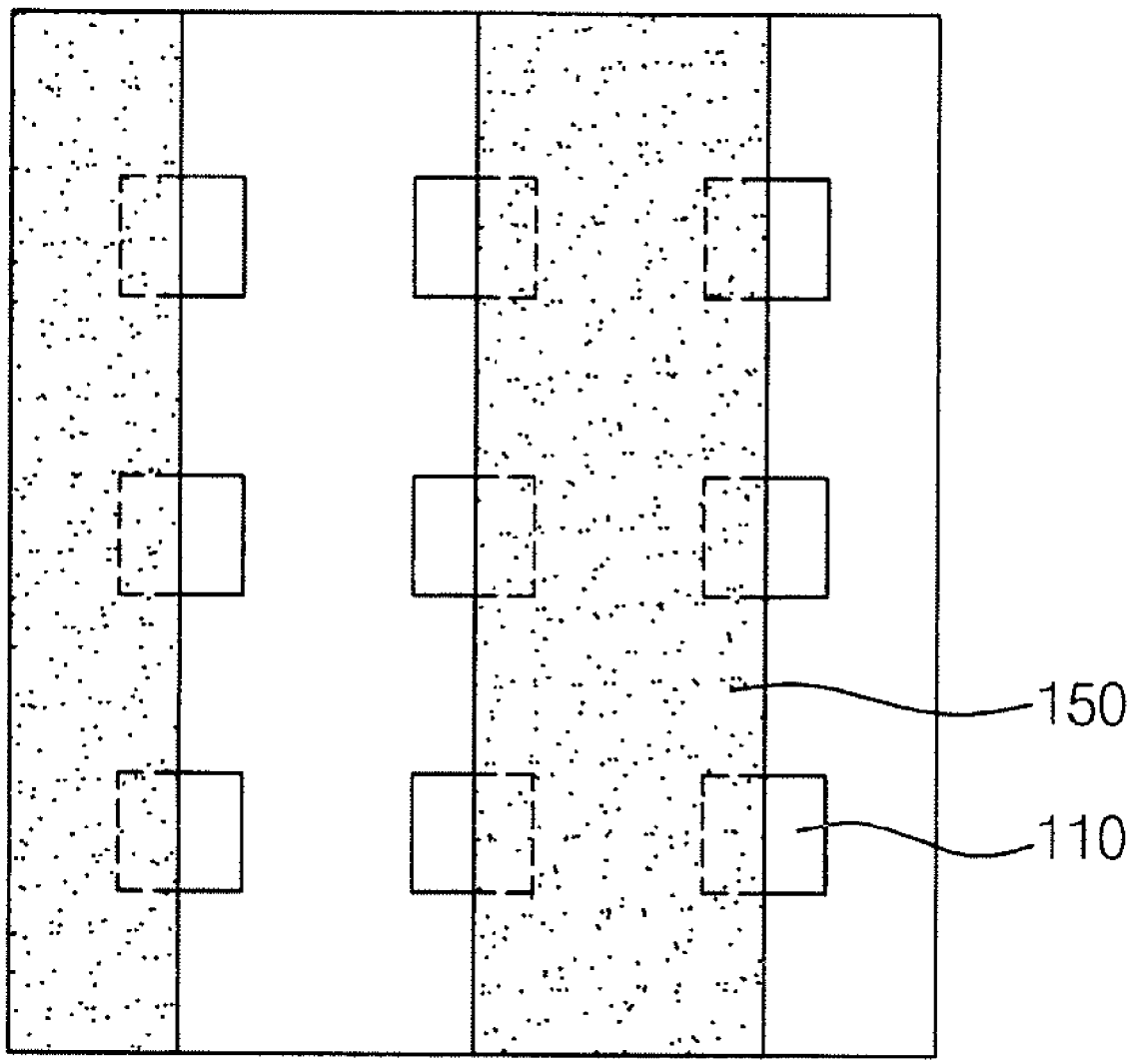
FIG. 3 is a plan view corresponding to FIG. 2C.
Figure 4A:
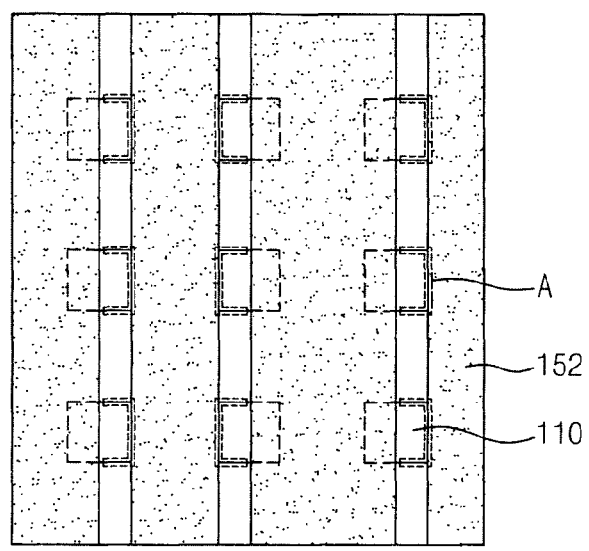
FIGS. 4A and 4B are plan views corresponding to FIG. 2G, showing the formation of word lines.
Figure 4B:
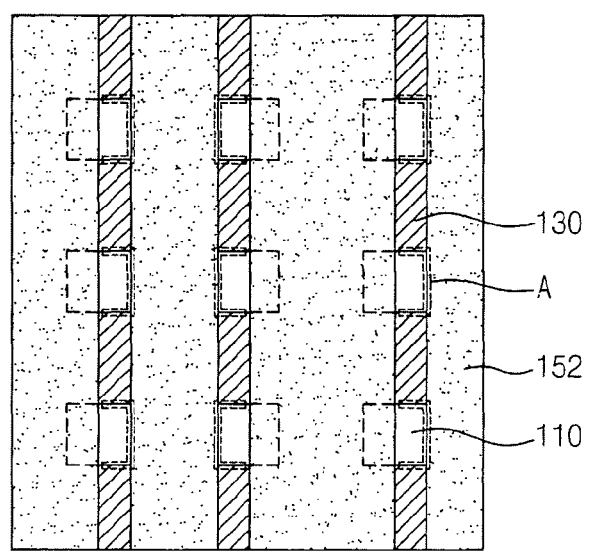

FIGS. 2A through 2H, 3, 4A and 4B are views showing a method for manufacturing a semiconductor device in accordance with another embodiment of the present invention. The method will be described below with reference to these drawings. Here, FIGS. 2A through 2H are cross-sectional views showing the processes of the method, FIG. 3 is a plan view corresponding to FIG. 2C, and FIGS. 4A and 4B are plan views corresponding to FIG. 2G, describing the formation of word lines.

Referring to FIG. 2A, a pad oxide layer 101 and a pad nitride layer 102 are sequentially formed on a silicon substrate 100 having a plurality of silicon pillar forming areas, and then a hard mask 103 is formed by selectively etching the pad nitride layer 102 and the pad oxide layer 101 to cover the silicon pillar forming areas of the silicon substrate 100. First grooves H1 having a predetermined depth are then defined, by etching the exposed portions of the silicon substrate 100 using the hard mask 103 as an etch mask.

Referring to FIG. 2B, a first oxide layer 104 and a first nitride layer 105 are sequentially formed on the hard mask 103, including the surfaces of the first grooves H1. Then, first spacers 106 are formed on the sidewalls of the first grooves H1 and the hard mask 103 by etching back the first nitride layer 105 and the first oxide layer 104. Then, using the hard mask 103, including the first spacers 106 as an etch mask, second grooves H2 are defined by etching portions of the silicon substrate 100 below the first grooves H1. Through this process, a plurality of silicon pillars 110 defined by the first grooves H1 and the second grooves H2 are formed, and the plurality of silicon pillars 110 are arranged in the form of a matrix.

A second oxide layer 107 and a second nitride layer 108 are sequentially formed on the surfaces of the second grooves H2, the first spacers 106, and the hard mask 103. Then, second spacers 109 are formed on the sidewalls of the second grooves H2 and the first spacers 106 by etching back the second nitride layer 108 and the second oxide layer 107.

Referring to FIG. 2C, a first insulation layer 142, which comprises an oxide layer, is formed on the silicon substrate 100 to fill the gaps between the silicon pillars 110 also formed on the silicon substrate 100. Then the first insulation layer 142 is removed until the hard mask 103 is exposed. This removal of the first insulation layer 142 is implemented through an etch-back process or a chemical mechanical polishing (CMP) process. Next, the portions of the first insulation layer 142 filled in gate forming gaps are removed, such that the first insulation layer 142 is present only in the gaps between the silicon pillars 110 excluding the gate forming gaps.

Here, as shown in FIG. 3, the selective removal of the first insulation layer 142 is implemented in a manner such that, after forming a first photoresist pattern 150 on the resultant silicon substrate 100, formed with the first insulation layer 142 to expose the gate forming gaps, the portions of the first insulation layer 142 filled in the gate forming gaps and are exposed through the first photoresist pattern 150, are removed.

Referring to FIG. 2D, the portions of the second spacers 109 that are exposed in the gate forming gaps are removed. Then, concave third grooves H3 are defined by isotropically etching the lower portions of the surfaces of the silicon pillars 110 in the gate forming gaps that correspond to the sidewalls of the second grooves H2 in the gate forming gaps, which are exposed due to the removal of the second spacers 109. As a result, the concave third grooves H3 are defined in the lower portions of the surfaces of the silicon pillars 110, which face each other in the gate forming gaps. The third grooves H3 are defined only on the exposed surfaces of the silicon pillars 110 and do not extend annularly.

Referring to FIG. 2E, a gate insulation layer 112 comprising an oxide layer, and the like, and a gate conductive layer 113 comprising a polysilicon layer, and the like, are sequentially formed on the resultant silicon substrate 100 having the third grooves H3 defined therein. Then, gates 114 are formed such that they are buried in the third grooves H3 by anisotropically etching the gate conductive layer 113 and the gate insulation layer 112. Here, the gates 114 are formed such that they fill the third grooves H3 while covering only the exposed surfaces of the lower portions of the silicon pillars 110.

Referring to FIG. 2F, the first insulation layer 142, which is filled in the gaps between the silicon pillars 110, excluding the gate forming gaps, is removed. Then, an ion implantation layer is formed in portions of the silicon substrate 100 below the gates 114 including the second grooves H2 by conducting ion implantation of predetermined conductivity type impurities (e.g., N-type impurities) on the resultant silicon substrate 100 after the removal of the first insulation layer 142. Then, drain areas 118 are defined in the portions of the silicon substrate 100 by etching the ion implantation layer.

Referring to FIG. 2G, a second insulation layer 144 comprising an oxide layer is deposited on the resultant silicon substrate 100 to fill the gaps between the silicon pillars 110 including the gates 114. Then, the second insulation layer 144 is etched back or chemically and mechanically polished (CMPed) until an upper surface of the hard mask 103 is exposed. Then, the second insulation layer 144 is etched according to the damascene process well known in the art thereby defining trenches to expose the gates 114 arranged perpendicular to a direction in which the drain areas 118 are arranged. Then word lines 130 (see FIG. 4B) are formed to connect the gates 114, which are arranged perpendicular to the direction in which the drain areas are formed, by filling the trenches with a conductive layer, for example, a polysilicon layer. Thereupon, a third insulation layer (not shown) is deposited on the word lines 130 between the silicon pillars 110 to cover the word lines 130.

The forming of the word lines 130 is described below in detail.

First, as shown in FIG. 4A, a second photoresist pattern 152 is formed on the silicon substrate 100, which is formed with the second insulation layer 144 to expose word line forming areas, that is, portions of the second insulation layer 144 which are placed over and between the gates 114 arranged in a predetermined direction. Then trenches (not shown) are defined in the second insulation layer 144 to expose the gates 114 arranged in the predetermined direction by etching the portions of the second insulation layer 144 exposed through the second photoresist pattern 152.

Then, as shown in FIG. 4B, word lines 130 are formed to connect the gates 114 arranged in the predetermined direction by filling a conductive layer comprising a polysilicon layer, and the like, in the trenches.

In FIGS. 4A and 4B, the reference symbol A designates an area in which the gate 114 is formed.

Referring to FIG. 2H, the hard mask 103 and the portions of the second insulation layer 144, which exist above the upper surfaces of the silicon pillars 110 are simultaneously removed such that upper surfaces of the silicon pillars 110 are exposed. Next, ion implantation process of predetermined conductivity type impurities is performed (e.g., N-type impurities) on the exposed portions of the silicon pillars 110 over the gates 114. Then source areas 116 are formed in the exposed portions of the silicon pillars 110 over the gates 114 by annealing the resultant silicon substrate 100 which is ion-implanted with the N-type impurities. Through this, vertical pillar transistors 120 including the gates 114, the source areas 116, and the drain areas 118a are formed. While the annealing is conducted, as the N-type impurities in the drain areas 118a are diffused, the drain areas 118a, which are arranged perpendicular to the direction in which the gates 114 are formed, are connected with one another, resulting in the formation of the floating bodies of the transistors.

Here, in the vertical pillar transistors 120 according to an embodiment of the present invention, the operations of floating body memories are enabled since the gates 114 are formed to cover a single surface of the silicon pillars 110, rather than to completely surround the lower portions of the silicon pillars 110.

Thereafter, while not shown in the drawings, by sequentially conducting a series of subsequent processes including processes for forming storage node contacts to be brought into contact with the source areas 116 of the vertical pillar transistors 120, the manufacture of a semiconductor device having floating body memory cells of a vertical pillar transistor structure according to the present invention is completed.

As is apparent from the above description, in the present invention, a semiconductor device capable of operating as floating body memories having a vertical pillar transistor structure is realized using an ordinary silicon substrate through changing a gate forming position.

Accordingly, in the present invention, since the use of a costly SOI wafer can is not necessary, the manufacturing cost can be decreased. Further, according to the present invention, it is possible to prevent defects associated with the stacked structure of the SOI wafer, and as such the characteristics and the reliability of the semiconductor device can be improved. Also, due to the fact that the semiconductor device capable of operating as floating body memories is manufactured using vertical pillar transistors, the present invention can be advantageously adapted for the manufacture of a highly integrated semiconductor device.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. A semiconductor device comprising:
   a plurality of vertical pillar transistors formed in respective silicon pillars of a silicon substrate, the silicon pillars each having an upper portion and a lower portion, each vertical pillar transistor comprising:
      a gate selectively formed on a single surface of only the lower portion of the silicon pillar, wherein the gates of the two adjacent vertical pillar transistors are selectively formed only on opposite surfaces of the two adjacent vertical pillar transistors, such that the gates of the two adjacent vertical pillar transistors face each other; and
      a drain area, wherein the drain areas of two adjacent vertical pillar transistors are connected, such that the bodies of the vertical pillar transistors are floated.

2. The semiconductor device according to claim 1, wherein the gate is buried in the single surface of the lower portion of the silicon pillar.

3. A semiconductor device comprising:
   a silicon substrate comprising a plurality of silicon pillars, each silicon pillar having an upper portion and lower portion and comprising;
      a gate formed on a single surface of only the lower portion of the silicon pillars, wherein the gates of the two adjacent vertical pillar transistors are selectively formed only on opposite surfaces of the two adjacent vertical pillar transistors, such that the gates of the two adjacent vertical pillar transistors face each other;
      a source area formed in the upper portion of the silicon pillars above the gate;
      a drain area formed in a portion of the silicon substrate below the gate, such that the drain area, the gate, and the source area constitutes a vertical pillar transistor; and
      a word line connecting the gates of two adjacent vertical pillar transistors and arranged in a direction,
      wherein the drain areas of the two vertical pillar transistors are connected, such that the bodies of the vertical pillar transistors are floated, and formed perpendicular to the direction of the word line.

4. The semiconductor device according to claim 3, wherein the gate is buried in the single surface of the lower portion of the silicon pillar.

5. The semiconductor device according to claim 3, further comprising:
   an insulation layer interposed between the two adjacent vertical pillar transistors including the word line.

6. A method for manufacturing a semiconductor device wherein gates of vertical pillar transistors are respectively formed on each silicon pillar of a plurality of silicon pillars of a silicon substrate, and drain areas of the vertical pillar transistors are formed to be connected with one another, such that the bodies of the vertical pillar transistors are floated, wherein each of the silicon pillars has an upper portion and a lower portion and the gates are formed on a single surface of only the lower portion of each of the silicon pillars,
   wherein the gates of the two adjacent vertical pillar transistors are selectively formed only on opposite surfaces of the two adjacent vertical pillar transistors, such that the gates of the two adjacent vertical pillar transistors face each other.

7. The method according to claim 6, wherein the gates are buried in the single surface of the lower portions of each silicon pillar of the plurality of silicon pillars.

* * * * *